United States Patent
Zhang et al.

(10) Patent No.: US 9,521,082 B2
(45) Date of Patent: *Dec. 13, 2016

(54) METHODS AND DEVICES FOR CREATING, COMPRESSING AND SEARCHING BINARY TREE

(71) Applicant: Huawei Technologies Co., Ltd., Shenzhen (CN)

(72) Inventors: Wenyong Zhang, Beijing (CN); Hui Wang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 140 days.

This patent is subject to a terminal disclaimer.

(21) Appl. No.: 14/213,167

(22) Filed: Mar. 14, 2014

(65) Prior Publication Data

US 2014/0198807 A1    Jul. 17, 2014

Related U.S. Application Data

(63) Continuation of application No. 13/353,884, filed on Jan. 19, 2012, now Pat. No. 8,711,014, which is a (Continued)

(51) Int. Cl.
*H04L 12/851* (2013.01)
*H03M 7/30* (2006.01)
(Continued)

(52) U.S. Cl.
CPC ........... *H04L 47/2441* (2013.01); *G06N 5/003* (2013.01); *H03M 7/3066* (2013.01);
(Continued)

(58) Field of Classification Search
CPC ....... G06N 5/003; H03M 7/3066; H03M 7/40; H03M 7/6058; H03M 7/707; H04L 45/48; H04L 47/2441; H04L 69/22
(Continued)

(56) References Cited

U.S. PATENT DOCUMENTS 5,649,030 A  *  7/1997  Normile ................. G06T 9/008
                                                    348/417.1
6,504,931 B1   1/2003  Yoshiura et al.
(Continued)

FOREIGN PATENT DOCUMENTS

CN    101022407 A    8/2007
CN    101241499 A    8/2008
(Continued)

OTHER PUBLICATIONS

International Search Report issued in corresponding PCT Patent Application No. PCT/CN2010/076299, mailed Jun. 9, 2011, 6 pages.
Extended European Search Report issued in corresponding European Patent Application No. 10847261.4, mailed Jul. 24, 2012, 13 pages.
Ai-fang et al., "Multi-field Packet Classification Algorithm Based on Aggregated and Folded Vector" Application Research of Computers, vol. 24 No. 9, Sep. 2007, 6 pages.
(Continued)

*Primary Examiner* — Nizam Ahmed
(74) *Attorney, Agent, or Firm* — Brinks Gilson & Lione

(57) ABSTRACT

Methods and devices for creating, compressing and searching a binary tree are provided by the present disclosure, which relates to the field of traffic classification. Binary tree compression includes: determining a number of a compression layer or a number of an intermediate node, compressing a binary tree according to the number of the compression layer or the number of the intermediate node to form at least one compression node, and creating a bitmap of the compression node. Therefore, the depth of the decision tree is reduced, the search speed is increased, rule expansion is avoided, and rule replication is reduced.

8 Claims, 10 Drawing Sheets

Related U.S. Application Data continuation of application No. PCT/CN2010/076299, filed on Aug. 24, 2010.

(51) Int. Cl.
    *H03M 7/40*     (2006.01)
    *H04L 12/753*     (2013.01)
    *G06N 5/00*     (2006.01)
    *H04L 29/06*     (2006.01)

(52) U.S. Cl.
    CPC ........... *H03M 7/40* (2013.01); *H03M 7/6058* (2013.01); *H03M 7/707* (2013.01); *H04L 45/48* (2013.01); *H04L 69/22* (2013.01)

(58) Field of Classification Search
    USPC ........................................................ 370/474
    See application file for complete search history.

(56) References Cited

U.S. PATENT DOCUMENTS

| | | | |
|---|---|---|---|
| 6,594,394 | B1 | 7/2003 | Stromberg et al. |
| 6,983,334 | B2 | 1/2006 | Riedle |
| 6,996,071 | B2 | 2/2006 | Perkinson et al. |
| 7,016,908 | B2 * | 3/2006 | Kataoka ................ G06F 3/0608 |
| 7,039,641 | B2 | 5/2006 | Woo |
| 7,249,149 | B1 | 7/2007 | Eatherton et al. |
| 7,539,153 | B1 | 5/2009 | Liang et al. |
| 7,561,162 | B2 | 7/2009 | Mihara et al. |
| 2003/0236793 | A1 | 12/2003 | Karlsson |

FOREIGN PATENT DOCUMENTS

| | | |
|---|---|---|
| CN | 100536435 C | 9/2009 |
| CN | 101741708 A | 6/2010 |
| WO | WO 2008/014188 A1 | 1/2008 |

OTHER PUBLICATIONS

Fei-Fei et al., "Non-backtracking Longest Prefix Match Search Algorithm" Computer Engineering, vol. 34 No. 10, May 2008, 4 pages.

Lu et al., "A B-Tree Dynamic Router-Table Design" IEEE Transactions on Computers vol. 54 No. 7, Jul. 2005, 12 pages.

Song et al., "Shape Shifting Tries for Faster IP Route Lookup" Proceedings of the 13th IEEE International Conference on Network Protocols (ICNP'05) IEEE 2005, 10 pages.

Woo, "A Modular Approach to Packet Classification: Algorithms and Results" IEEE 2000, 10 pages.

Weiqiang et al., "Expanded Compressed Trie Algorithm—a Trie-based Fast Routing Lookup Algorithm" vol. 22, 2001, 4 pages.

Jin-ge et al., "Research on Rule Conversion Method in Packet Classification Algorithm" Computer Engineering, vol. 35 No. 9, May 2009, 3 pages.

Xing-Miao et al., "A Multi-dimensional Packet Classification Algorithm with Trees Divided by Value" Journal of Electronics & Information Technology, vol. 26 No. 8, Sep. 2004, 7 pages.

Yi et al., "Research on Packet Classification Algorithm" Application Research of Computers, vol. 24 No. 4, Apr. 2007, 7 pages.

Ke et al., "Survey on Routing Lookup Algorithms" Journal of Software, vol. 13 No. 1, 2002, 9 pages.

Office Action issued in corresponding Chinese Patent Application No. 201080003336.3, mailed May 9, 2013 (including partial English Translation), 7 pages.

Written Opinion of the International Searching Authority issued in corresponding PCT Application No. PCT/CN2010/076299, mailed Jun. 9, 2011, 6 pages.

Chinese Search Report issued in corresponding Chinese Patent Application No. 201080003336.3, dated Apr. 26, 2013, 3 pages.

Sun, Weidiang et al., "Expanding Compressed Trie Algorithm—a Trie-based Fast Routing Lookup Algorithm" China University of Science and Technology, published Nov. 15, 2001: 1-4.

Partial English Translation of previously cited Chinese publication No. 101741708A, 22 pages.

* cited by examiner

METHODS AND DEVICES FOR CREATING, COMPRESSING AND SEARCHING BINARY TREE

CROSS-REFERENCE TO RELATED APPLICATIONS

This application is a continuation of U.S. patent application Ser. No. 13/353,884, filed on Jan. 19, 2012, which is a continuation application of International Application No. PCT/CN2010/076299, filed on Aug. 24, 2010, which are hereby incorporated by reference in their entirety.

FIELD

The present disclosure relates to the field of traffic classification, and in particular, to methods and devices for creating, compressing and searching a binary tree.

BACKGROUND

In traffic classification, multiple fields of a packet header are checked according to a predefined rule, and corresponding processing is performed based on a matching situation. A set of rules used in the traffic classification is called a traffic classifier. Each rule in the traffic classifier is related to several fields in the packet header. For example, a standard Internet Protocol Version 4 (IPv4) quintuple rule includes five fields, that is, a source IP address, a destination IP address, a protocol type, a source port number, and a destination port number. Matching modes vary for different fields. The IP address uses prefix matching; the protocol type uses precise matching; and the port number uses range matching.

A traffic classification algorithm based on a decision tree is a rule set segmentation algorithm which segments a rule set in a recursive manner by using a certain segmentation policy until the number of rules in each sub-rule set is less than a preset bucket size. A binary decision tree, called a binary tree for short, may be created through segmentation. An intermediate node of the binary tree saves the method for segmenting the rule set; and a leaf node of the binary tree saves all sub-rule sets that may be matched. In searching, related fields are extracted from a packet header to compose a keyword, and then, the keyword is used to traverse a created decision tree until a corresponding leaf node is found. The keyword is compared with a rule in the leaf node to finally obtain a rule that matches the packet and has the highest priority.

Currently, a Modular algorithm, which is a stage-by-stage bit selection segmentation traffic classification algorithm based on a decision tree, is provided. The Modular algorithm regards a rule as a 3-bit string composed of '0', '1' and '*' without a concept of dimension, in which the '*' represents a wildcard, and the binary digit of the '*' may be 0 or 1. In segmentation, the number of rules corresponding to a certain bit whose value is '0', '1' or '*' is calculated, and an optimal bit is selected for segmentation according to a priority metric formula. When a certain bit is selected for segmentation, rules with the value '0' of this bit are put in a sub-rule set; rules with the value '1' of this bit are put in another sub-rule set; and rules with the value '*' of this bit appear in both sub-rule sets. In this way, the original rule set is divided into two sub-rule sets. A range rule may be converted into a prefix before being segmented by using the aforementioned method. The original rule set is segmented in a recursive manner by using this method until the number of rules in each sub-rule set is less than a preset maximum number of rules allowed in the leaf node. In this way, a binary decision tree may be created. Meanwhile, in order to reduce rule replication, the Modular algorithm divides the rule set into four sub-rule sets which respectively correspond to four conditions, that is, neither source IP nor destination IP is '*', only source IP is '*', only destination IP is '*', and both source IP and destination IP are '*'. Different binary decision trees are created for the four sub-rule sets respectively. In searching, multiple binary decision trees are searched in a parallel manner.

During the implementation of the present disclosure, the inventors find that the prior art has at least the following problems.

When one bit is selected for segmentation, one binary decision tree is created in the end. The depth of the tree is large, which affects the decision efficiency. During the creation of the binary tree, if a range is extended to a prefix, a random range may be converted into 30 prefixes in the worst case. Taking a standard IPv4 quintuple as an example, each rule includes two ranges: a source port number and a destination port number; in the worst case, one rule is extended into 900 rules, which excessively occupies memory space. In addition, the method for reducing the rule replication in creating the binary tree is rough. When the sub-rule set includes many '*', a rule is still replicated for many times.

SUMMARY

To reduce the depth of a binary tree, an embodiment of the present disclosure provides a method for compressing a binary tree by a processor. The method includes: determining a compression parameter, in which the compression parameter is a number n of a compression layer or a number K of an intermediate node; compressing a binary tree according to the compression parameter to form at least one compression node; and creating a bitmap of the compression node.

To avoid rule expansion caused by conversion of a range rule into a prefix in creating a binary tree, this embodiment provides a method for creating a binary tree. The method includes: segmenting a non-range rule in a rule set by using a bit selection segmentation algorithm; converting a range rule in the rule set into a prefix when segmentation efficiency is lower than a preset threshold, and keeping an identifier of a rule corresponding to the prefix and an identifier corresponding to the range rule unchanged; segmenting a converted rule set by using the bit selection segmentation algorithm; and creating a binary tree corresponding to the rule set according to all segmentation results.

To reduce rule replication in creating a binary tree, this embodiment provides a method for creating a binary tree creation. The method includes: segmenting a rule set by using a bit selection segmentation algorithm; extracting rules in a segmentation process that need to be replicated, and putting the rules in another sub-rule set; and creating binary trees corresponding to the rule set and the another sub-rule set respectively.

To reduce search depth and increase search speed, this embodiment provides a method for searching a binary tree. The method includes: obtaining a search keyword; determining whether each node of a binary tree is a leaf node or a compression node; when the node is a compression node, parsing the compression node; and when the node is a leaf node, traversing a linear table corresponding to the leaf node to search for a rule matching the keyword.

To reduce the depth of a binary tree, an embodiment of the present disclosure provides a device for compressing a binary tree. The device includes: a determination module, configured to determine a compression parameter, in which the compression parameter is a number n of a compression layer or a number K of an intermediate node; a compression module, configured to compress a binary tree according to the compression parameter to form at least one compression node; and a bitmap module, configured to create a bitmap of the compression node.

To avoid rule expansion caused by conversion of a range rule into a prefix in creating a binary tree, this embodiment provides a device for creating a binary tree. The device includes: a first segmentation module, configured to segment a non-range rule in a rule set by using a bit selection segmentation algorithm; a conversion module, configured to convert a range rule in the rule set into a prefix when segmentation efficiency is lower than a preset threshold; and a second segmentation module, configured to segment the prefix by using the bit selection segmentation algorithm.

To reduce rule replication in creating a binary tree, this embodiment provides a device for creating a binary tree. The device includes: a segmentation module, configured to segment a rule set by using a bit selection segmentation algorithm; and an extraction module, configured to extract rules that need to be replicated, and put the rules in another sub-rule set.

To reduce search depth and increase search speed, this embodiment provides a device for searching a binary tree. The device includes: an obtaining module, configured to obtain a search keyword; a determination module, configured to determine whether each node of a binary tree is a leaf node or a compression node; and a processing module, configured to, when a node is a compression node, parse the compression node; and when a node is a leaf node, traverse a linear table corresponding to the leaf node to search for a rule matching the keyword.

The beneficial effects of the solutions provided in the embodiments of the present disclosure are as follows.

The number of the compression layer or the number of the intermediate node is determined, and multiple nodes are compressed into one node according to the number of the compression layer or the number of the intermediate node, and therefore the depth of a decision tree is greatly reduced and the search speed is increased.

The non-range rule in the rule set is first segmented by using the bit selection segmentation algorithm, and the range rule in the rule set is then converted into the prefix when the segmentation efficiency is lower than the preset threshold. Such a method of converting a range into a prefix "if necessary" effectively avoids the rule expansion caused when all ranges are converted into prefixes in creating the binary tree.

The rules that need to be replicated are extracted and put in another sub-rule set, that is, multiple decision trees are created, which therefore effectively reduces the rule replication in creating the binary tree.

It is determined whether each node of the binary tree is a leaf node or a compression node, and when the node is a compression node, the compression node is parsed; when the node is a leaf node, the linear table corresponding to the leaf node is traversed to search for the rule matching the keyword, and therefore the search depth of the binary tree is reduced and the search speed is increased.

DETAILED DESCRIPTION OF THE EMBODIMENTS

In order to make the objectives, solutions, and advantages of the present disclosure more comprehensible, the embodiments of the present disclosure are further described in detail below with reference to the accompanying drawings.

Embodiment 1

Figure 1:
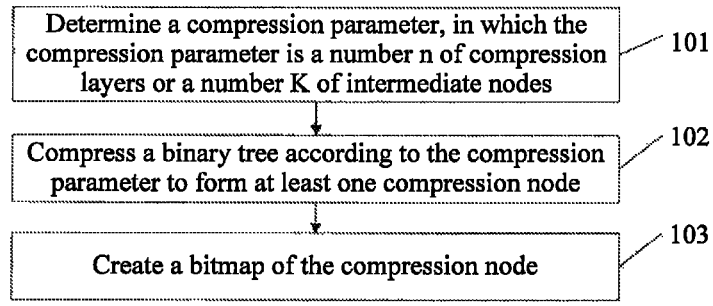
FIG. 1 is a flow chart of a method for compressing a binary tree according to Embodiment 1 of the present disclosure.

Referring to FIG. 1, this embodiment provides a method for compressing a binary tree by a processor, which includes the following steps:

101: Determine a compression parameter, in which the compression parameter is a number n of a compression layer or a number K of an intermediate node.

102: Compress a binary tree according to the compression parameter to form at least one compression node.

103: Create a bitmap of the compression node.

In the method according to this embodiment, the number of the compression layer or the number of the intermediate node is determined, and multiple nodes are compressed into one node according to the number of the compression layer or the number of the intermediate node, and therefore the depth of the decision tree is greatly reduced and the search speed is increased.

Embodiment 2

This embodiment provides a method for compressing a binary tree by a processor. The method compresses a binary tree according to a number of a compression layer, and is also called a shape compression method.

Figure 2:
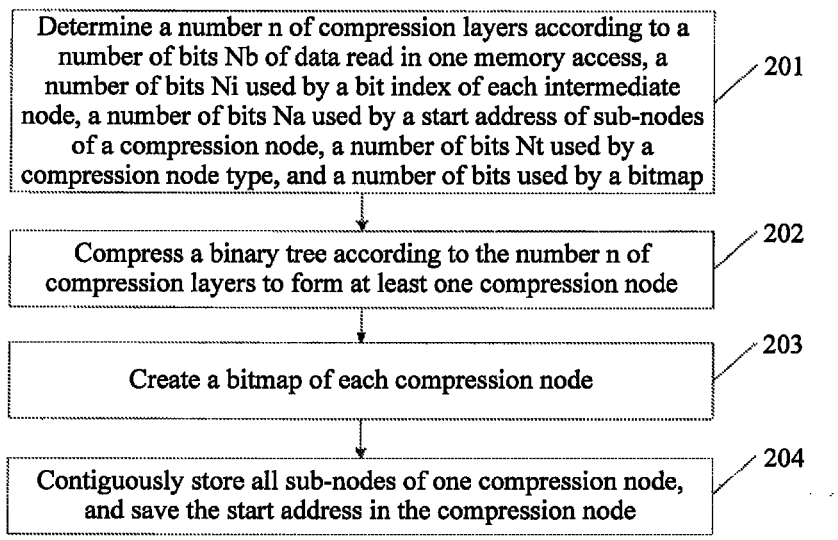
FIG. 2 is a flow chart of a shape compression method according to Embodiment 2 of the present disclosure.

Referring to FIG. 2, the shape compression method includes the following steps:

201: Determine a number n of the compression layer according to a number of bits Nb of data read in one memory access, a number of bits Ni used by a bit index of each intermediate node, a number of bits Na used by a start address of a sub-node of a compression node, a number of bits Nt used by a compression node type, and a number of bits used by a bitmap.

The sub-node of the compression node, also called a child node, refers to a node that is attached to the compression node.

For example, $$n \leq \mathrm{Log}_2\left(\frac{N_b - N_a - N_t}{N_i + 1} + 1\right)$$

is determined according to $(2^n-1) \times N_i + (2^n-1) + N_a + N_t \leq N_b$, where $(2^n-1)$ represents the number of bits used by the bitmap.

For example, assume Na=32, Nt=2, and Ni=9. Then, if Nb=128, n=3, that is, 3 layers may be compressed into one layer; and if Nb=256, n=4, that is, 4 layers may be compressed into one layer.

202: Compress a binary tree according to the number n of the compression layer to form at least one compression node.

For example, starting from a root node or leaf node of the binary tree, nodes within a layer number less than or equal to the number n of the compression layer are compressed as a compression node. Then, starting from a sub-node of the compression node, the binary tree is continuously compressed in the same way as compressing the compression node until the binary tree is traversed.

Figure 3:
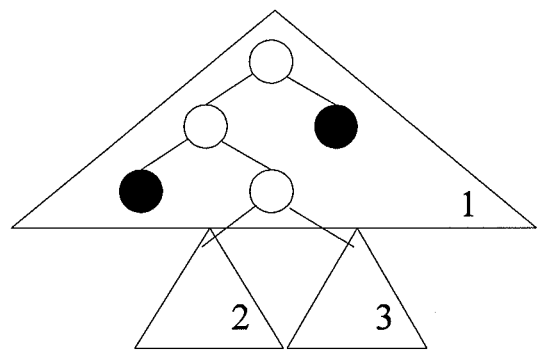
FIG. 3 is a schematic diagram of a binary tree fragment according to Embodiment 2 of the present disclosure.

For example, referring to FIG. 3, when the number of the compression layer is 3, starting from the root node of the binary tree, three layers of the binary tree are compressed into one layer to form a big compression node 1. Then, the compression is continued from the sub-node of the compression node 1 to form big compression nodes 2 and 3.

In addition, when the root node is a leaf node, the root node does not need to be compressed. In this case, no compression node exists.

203: Create a bitmap of each compression node.

For the shape compression method, the bitmap refers to a shape bitmap. For example, the compression node is traversed in a breadth-first order, and a type of each node in the compression node is identified in turn. For example, the intermediate node is identified as 1, the leaf node or an empty node is identified as 0, and an identification result is used as the shape bitmap of the compression node. The "breadth-first order" refers to an order from top to bottom and from left to right.

A binary tree fragment shown in FIG. 3 is taken as an example. A hollow circle represents an intermediate node, and a solid circle represents a leaf node; 1 represents an intermediate node, and 0 represents a leaf node or an empty node; and the compression node 1 is traversed in the breadth-first order, so the shape bitmap of the compression node 1 is 1100100, in which the last two bits of 0 represent empty nodes.

Figure 4:
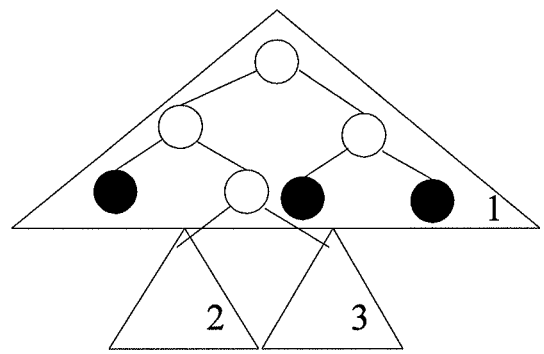
FIG. 4 is a schematic diagram of an updated binary tree fragment according to Embodiment 2 of the present disclosure.

Further, when the compression node is incrementally updated, the shape bitmap is updated directly. For example, referring to FIG. 4, an updated binary tree fragment is shown, and then the shape bitmap of an updated compression node 1 is 1110100.

204: Store all sub-nodes of one compression node contiguously, and save the start address in the compression node.

Further, in searching, an address of the sub-node is determined according to the start address and an index of the sub-node.

A node search process in the shape compression includes: obtaining a search keyword; determining whether each node of the binary tree is a leaf node or a compression node; when a node is a compression node, parsing the compression node; and when a node is a leaf node, traversing a linear table corresponding to the leaf node to search for a rule matching the keyword. For example, referring to FIG. 5, the binary tree search process is as follows:

A1: Obtain a search keyword.

A2: Determined whether a root node of a decision binary tree is a leaf node.

For example, if the root node is not a leaf node, the root node corresponds to a compression node which is used as a current compression node, and step A3 is executed; if the root node is a leaf node, step A5 is executed.

For example, the root node in FIG. 3 is not a leaf node, so the root node corresponds to a compression node, and step A3 is executed.

A3: Parse the current compression node.

A4: Determined whether a sub-node of the current compression node is a leaf node.

For example, if the sub-node is not a leaf node, the root node corresponds to a compression node which is used as a current compression node, and step A3 is executed; if the sub-node is a leaf node, step A5 is executed.

A5: Traverse a linear table corresponding to the leaf node to search for a rule matching the keyword; and ends the process.

Figure 5:
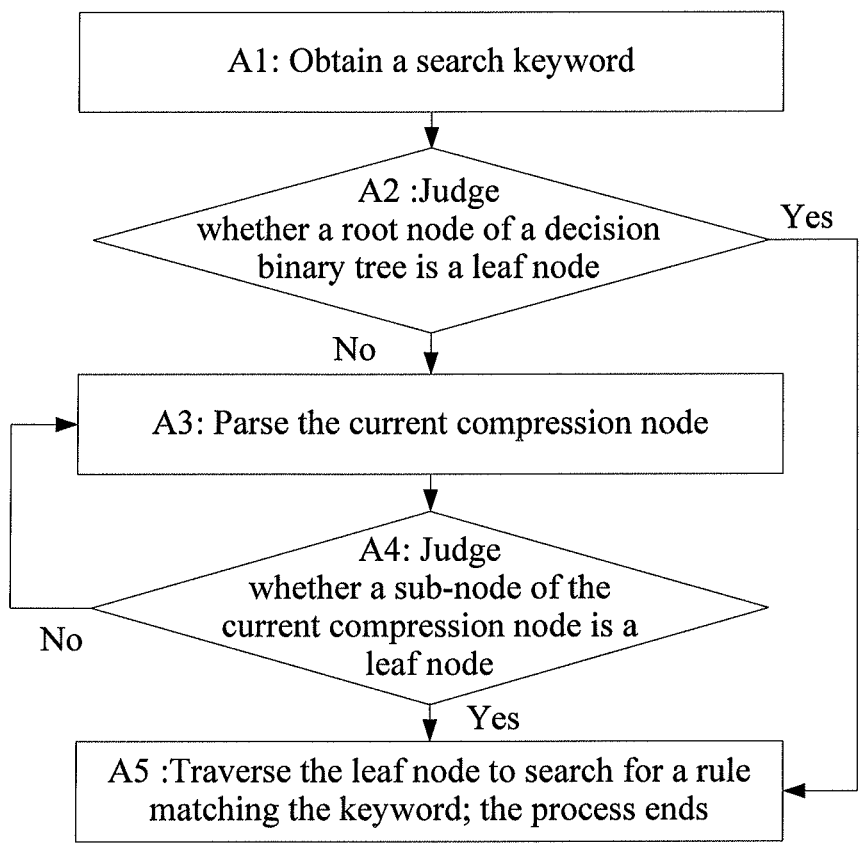
FIG. 5 is a flow chart of searching a binary tree search according to Embodiment 2 of the present disclosure.
Figure 6:
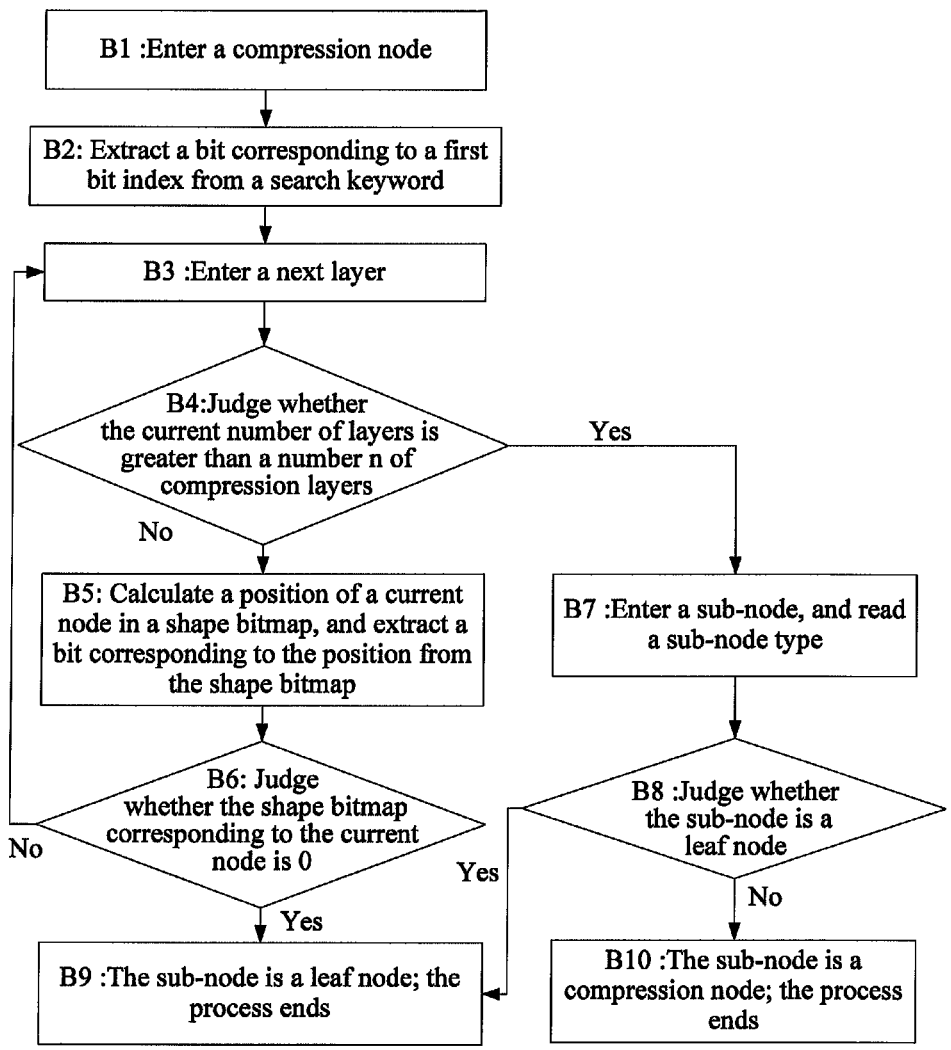
FIG. 6 is a flow chart of parsing of a compression node after shape compression according to Embodiment 2 of the present disclosure.

Based on the search process shown in FIG. 5, parsing by layer may be performed for the shape compression, in which the root node of the compression node is used as a first layer, and it is determined whether each node of the compression node is a leaf node according to the shape bitmap of the compression node. Referring to FIG. 6, the process of parsing the compression node is as follows:

B1: Enter a compression node.

B2: Extract a bit corresponding to a first bit index from a search keyword.

B3: Enter a next layer.

B4: Determine whether the current number of layers is greater than a number n of the compression layer.

For example, if the current number of layers is not greater than a number n of the compression layer, step B5 is executed; if the current number of layers is greater than a number n of the compression layer, step B7 is executed.

B5: Calculate a position of a current node (that is, a current binary tree node) in a shape bitmap, and extract a bit corresponding to the position from the shape bitmap.

B6: Determine whether the shape bitmap corresponding to the current node is 0.

For example, if the shape bitmap is 0, step B9 is executed; if the shape bitmap is not 0, step B3 is executed.

B7: Enter a sub-node, and read a sub-node type.

B8: Determine whether the sub-node is a leaf node.

For example, if the sub-node is a leaf node, step B9 is executed; if the sub-node is not a leaf node, step B10 is executed.

B9: The sub-node is a leaf node; the process ends.

B10: The sub-node is a compression node; the process ends.

In the method for searching, it is determined whether each node of the binary tree is a leaf node or a compression node, and when a node is a compression node, the compression node is parsed; when a node is a leaf node, the linear table corresponding to the leaf node is traversed to search for a rule matching the keyword, and therefore the search depth of the binary tree is reduced and the search speed is increased.

In the method according to this embodiment, the number of the compression layer is determined according to the number of bits of data read in one memory access, the number of bits used by the bit index of each intermediate node, the number of bits used by the start address, the number of bits used by the compression node type, and the number of bits used by the bitmap, and multiple nodes are compressed into one node according to the number of the compression layer, and therefore the depth of the decision tree is greatly reduced and the search speed is increased.

Embodiment 3

This embodiment provides a method for compressing a binary tree by a processor. The method compresses a binary tree according to a number of an intermediate node, and is also called an adaptive compression method.

First, a theorem used in this embodiment is introduced. If each intermediate node of a binary tree includes two sub-nodes, N connected the intermediate node with one of the intermediate node as a root must have (N+1) sub-nodes, which is proved as follows:

1) In a situation of only one intermediate node, the intermediate node must have two sub-nodes, which therefore satisfies the theorem.

2) In a situation of K connected the intermediate node with one of the intermediate node as a root, assume that the K intermediate nodes have (K+1) sub-nodes. In this case, if the number of connected the intermediate node becomes (K+1) while the intermediate node used as the root remains unchanged, one of original sub-nodes inevitably becomes an intermediate node to be considered. Because the sub-node is an intermediate node, the node must have two sub-nodes. Therefore, the number of sub-nodes becomes (K+1)−1+2= (K+1)+1.

The theorem is proved by combining 1) and 2).

Figure 7:
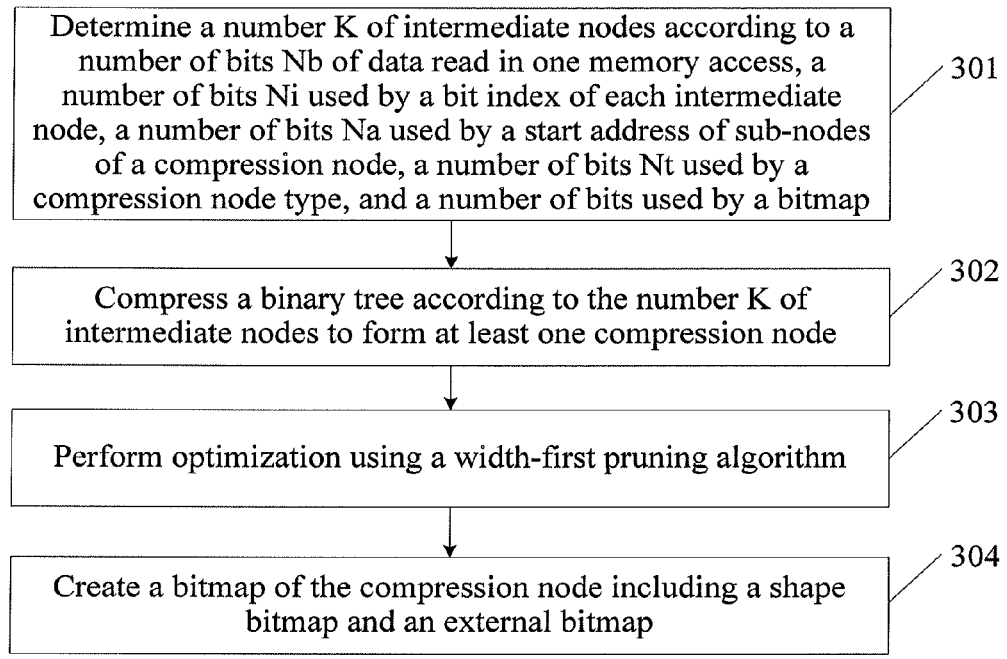
FIG. 7 is a flow chart of an adaptive compression method according to Embodiment 3 of the present disclosure.

Referring to FIG. 7, the adaptive compression method includes the following steps:

301: Determine a number K of the intermediate node according to a number of bits Nb of data read in one memory access, a number of bits Ni used by a bit index of each intermediate node, a number of bits Na used by a start address of a sub-node of a compression node, a number of bits Nt used by a compression node type, and a number of bits used by a bitmap.

For the adaptive compression method, the bitmap refers to a shape bitmap and an external bitmap. The shape bitmap is used to represent the type of each node in the compression node. The external bitmap is used to represent the type of each sub-node in the compression node.

For example, $$K \leq \frac{N_b - N_a - N_t + 1}{N_i + 3}$$

is determined according to $K \times N_i + 2(K-1) + K + 1 + N_a + N_t \leq N_b$.

$2(K-1)$ represents the number of bits used by the shape bitmap. One compression node involves $2K+1$ nodes in total, and the first node of a compressed binary tree fragment is surely the intermediate node, so the first bit of the shape bitmap is surely 1; and the last two nodes are surely uncompressed nodes, so the last two bits of the shape bitmap are surely '00'. Therefore, the shape bitmap is represented by $2K+1-3=2(K-1)$. Because a total of K+1 external nodes exist, the external bitmap is represented by K+1 bits.

302: Compress a binary tree according to the number K of the intermediate node to form at least one compression node.

For example, starting from a root node of the binary tree, a node with the number less than or equal to the number K of the intermediate node are used as a compression node; and starting from the sub-node of the compression node, the binary tree is continuously compressed in the same way as compressing the compression node until the binary tree is traversed.

For example, assume that Na=32, Nt=2, Ni=9, so when Nb=128, the number K of the intermediate node equals 8, and the number n of the compression layer equals 3. Referring to the binary tree fragment shown in FIG. 8, if the shape compression method according to Embodiment 2 is used, every 3 layers are compressed into one big node (namely, a compression node), and a fragment should be compressed into three big nodes. According to the adaptive compression method according to this embodiment, every 8 intermediate nodes are compressed into one big node; therefore, the fragment only needs to be compressed into one big node, and thereby higher compression efficiency is achieved.

In addition, when the root node is a leaf node, the root node does not need to be compressed. In this case, no compression node exists.

303: Use a breadth-first pruning algorithm for optimization so as to further improve the compression efficiency.

For example, a number of all sub-intermediate nodes of each intermediate node including the intermediate node itself is counted; starting from the root node of the binary tree, it is determined whether the number of all sub-intermediate nodes corresponding to the intermediate node including the intermediate node itself is less than or equal to the number K of the intermediate node; when the number of all sub-intermediate nodes corresponding to each intermediate node in the compression node including the intermediate node itself is greater than the number K of the intermediate node, the compression node remains unchanged; when the number of all sub-intermediate nodes corresponding to the intermediate node in the compression node including the intermediate node itself is less than or equal to the number K of the intermediate node, the intermediate node and all the sub-nodes of the intermediate node are pruned and used as a new compression node. After the pruning, other nodes in the compression node than the intermediate node are still kept in the compression node, that is, the number of the intermediate node in the compression node associated with the compression node formed by pruning is adjusted.

For example, if a calculated number K of the intermediate node equals 7, and in a binary tree fragment shown in FIG.

Figure 10:
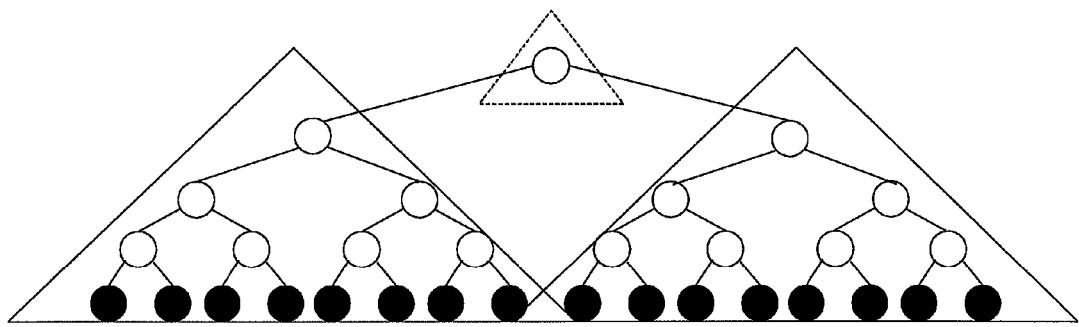
FIG. 10 is a schematic diagram of breadth-first pruning of another binary tree fragment according to Embodiment 3 of the present disclosure.

9, a hollow circle represents an intermediate node, and a solid circle represents a leaf node, the binary tree fragment needs to be compressed into 9 compression nodes by using the adaptive compression method. In the breadth-first pruning algorithm, the number of all sub-intermediate nodes of a first intermediate node including the first intermediate node itself is calculated as 15, which is greater than K, so the first intermediate node is not pruned; the number of all sub-intermediate nodes of a second intermediate node including the second intermediate node itself is calculated as 7, which is less than or equal to K, so the second intermediate node and all the sub-nodes of the second intermediate node are pruned and used as a compression node; in a same way, the number of all sub-intermediate nodes of a third intermediate node including the third intermediate node itself is calculated as 7, which is less than or equal to K, so the third intermediate node and all the sub-nodes of the third intermediate node are pruned and used as a compression node; after the pruning, the number of the intermediate node of the compression node associated with the two compression nodes formed by pruning is adjusted to 1; in the end, only 3 compression nodes are formed, referring to FIG. 10 for details, which greatly improves the compression efficiency.

304: Create a bitmap of the compression node, including a shape bitmap and an external bitmap.

For the shape bitmap, the compression node is traversed in a breadth-first order, the type of each node in the compression node is identified in turn, and an identification result is used as the shape bitmap of the compression node.

For the external bitmap, the compression node is traversed in the breadth-first order, the type of each sub-node is identified in turn, and an identification result is used as the external bitmap of the compression node.

Figure 8:
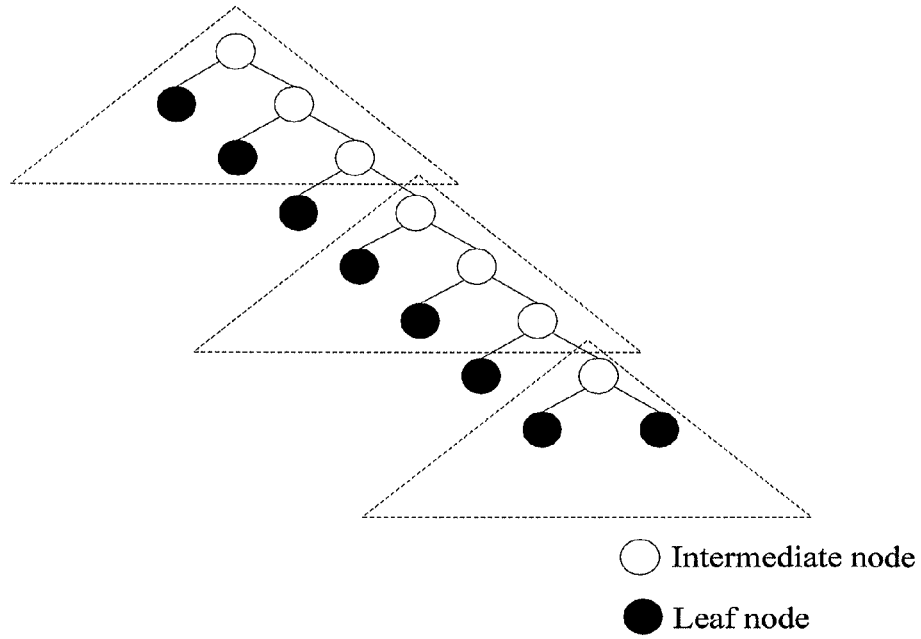
FIG. 8 is a schematic diagram of a binary tree fragment according to Embodiment 3 of the present disclosure.
Figure 9:
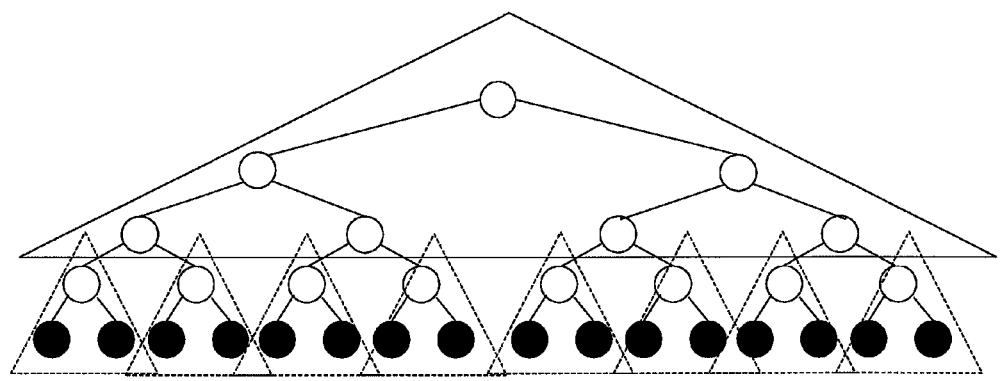
FIG. 9 is a schematic diagram of adaptive compression of another binary tree fragment according to Embodiment 3 of the present disclosure.

Still taking FIG. 8 as an example, the shape bitmap excluding a first node and last two nodes requires a total of 2(K−1)=12 bits, which is 010101010101; and the external bitmap requires a total of K+1 bits, which is 00000000.

Further, an incremental update may be implemented through the shape bitmap and the external bitmap. That is, when the type of the sub-node of the compression node changes, the bit in the external bitmap corresponding to the sub-node whose type changes is adjusted, and the shape bitmap remains unchanged, so as to implement the incremental update. For example, if a leaf node is attached to a first leaf node in FIG. 8 so that the first leaf node becomes an intermediate node, a corresponding bit in the external bitmap changes from 0 to 1, and the type of other sub-nodes remains unchanged, so the external bitmap is updated to 10000000, while the shape bitmap remains unchanged.

Figure 11:
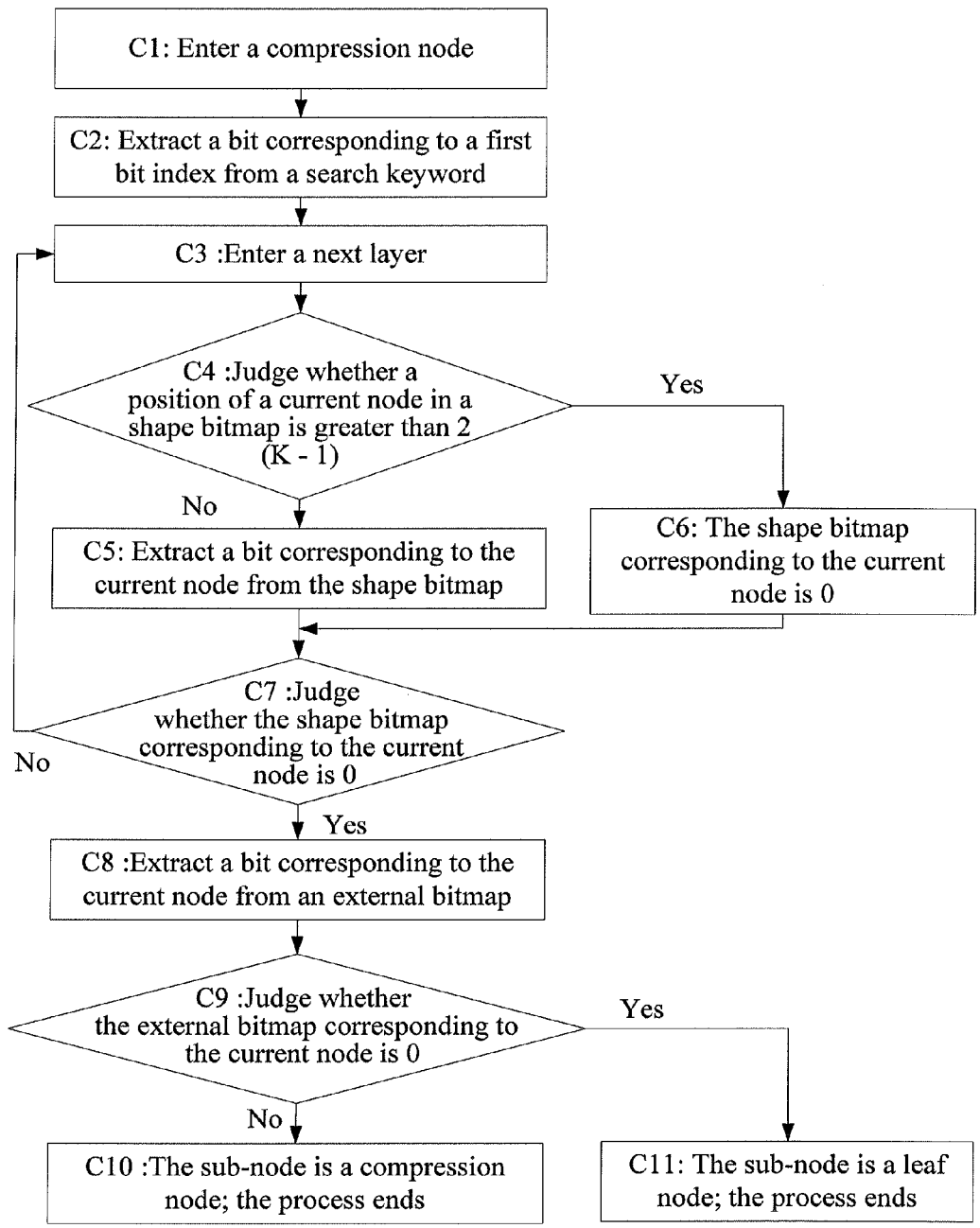
FIG. 11 is a flow chart of parsing of a compression node after adaptive compression according to Embodiment 3 of the present disclosure.

After the above adaptive compression, parsing by layer may be performed for the adaptive compression based on the search process shown in FIG. 5, in which the root node of the compression node is used as a first layer, it is determined whether a node in the compression node is 0 in the external bitmap when the node is 0 in the shape bitmap according to the shape bitmap of the compression node, and it is determined, according to a determination result, whether the sub-node corresponding to the node in the compression node is a leaf node. Referring to FIG. 11, the process of parsing the compression node is as follows:

C1: Enter a compression node.

C2: Extract a bit corresponding to a first bit index from a search keyword.

C3: Enter a next layer.

C4: Determine whether a position of a current node (that is, a current binary tree node) in a shape bitmap is greater than 2(K−1).

For example, if a position of a current node (that is, a current binary tree node) in a shape bitmap is not greater than 2(K−1), step C5 is executed; if yes, that is, the position of the current node is greater than 2(K−1), step C6 is executed.

C5: Extract a bit corresponding to the current node from the shape bitmap, and execute step C7.

C6: The shape bitmap corresponding to the current node is 0.

C7: Determine whether the shape bitmap corresponding to the current node is 0.

For example, if the shape bitmap corresponding to the current node is not 0, step C3 is executed; if yes, that is, the shape bitmap is 0, step C8 is executed.

C8: Extract a bit corresponding to the current node from an external bitmap.

C9: Determine whether the external bitmap corresponding to the current node is 0.

For example, if the external bitmap is not 0, step C10 is executed; if the external bitmap is 0, step C11 is executed.

C10: The sub-node is a compression node; the process ends.

C11: The sub-node is a leaf node; the process ends.

In the method for searching, it is determined whether each node of the binary tree is a leaf node or a compression node, and when the node is a compression node, the compression node is parsed; when the node is a leaf node, the linear table corresponding to the leaf node is traversed to search for a rule matching the keyword, and therefore the search depth of the binary tree is reduced and the search speed is improved.

In the method according to this embodiment, the number of the intermediate node is determined according to the number of bits of data read in one memory access, the number of bits used by the bit index of each intermediate node, the number of bits used by the start address, the number of bits used by the compression node type, and the number of bits used by the bitmap, and multiple nodes are compressed into one node according to the number of the intermediate node, and therefore the depth of the decision tree is greatly reduced and the search speed is improved. Besides, the breadth-first pruning method is used, which further improves the compression efficiency and reduces the depth of the decision tree.

Embodiment 4

Figure 12:
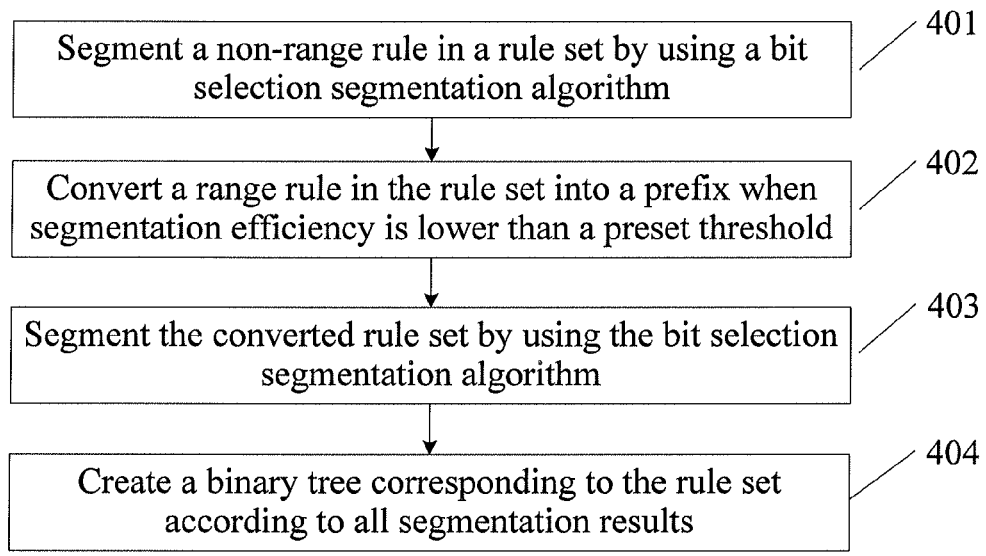
FIG. 12 is a flow chart of a method for creating a binary tree according to Embodiment 4 of the present disclosure.

Referring to FIG. 12, this embodiment provides a method for creating a binary tree by a processor. The method includes the following steps:

401: Segment a non-range rule in a rule set by using a bit selection segmentation algorithm.

For example, a bit with the highest segmentation efficiency and least replication is selected each time. In addition, this embodiment does not limit a specific segmentation method.

402: Convert a range rule in the rule set into a prefix when segmentation efficiency is lower than a preset threshold.

In the conversion, an identifier of a rule corresponding to the prefix and an identifier of a rule corresponding to a range remain unchanged.

Figure 13:
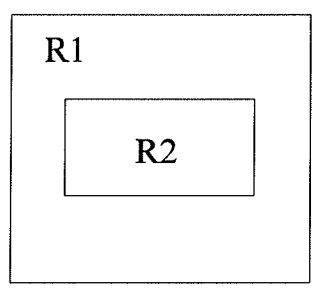
FIG. 13 is a schematic diagram of rule coverage according to Embodiment 4 of the present disclosure.

After the conversion, rules may overlap each other, and a rule that is completely covered and has a low priority is removed. For example, referring to FIG. 13, if the priority of Rule R1 is higher than that of Rule R2, and meanwhile R1 completely covers R2, R2 may never be targeted, and therefore may be removed from the rule set. In addition, in the leaf node, if identifiers of multiple rules are the same, only one rule corresponding to the identifier is kept.

403: Segment the converted rule set by using the bit selection segmentation algorithm.

404: Create a binary tree corresponding to the rule set according to all segmentation results.

All the segmentation results include the segmentation result of the non-range rule in the rule set and the segmentation result of the converted rule set.

Further, to solve the problem of rule replication, rules that need to be replicated are extracted in the segmentation process by using the bit selection segmentation algorithm, and put in another sub-rule set, that is, an extra decision tree is created.

In addition, after the range is converted, extended multiple rules share the same identifier with original rules. Therefore, all rules with the same identifier that need to be replicated should be extracted and put in the another sub-rule set.

In the method according to this embodiment, the non-range rule in the rule set is first segmented by using the bit selection segmentation algorithm, and the range rule in the rule set is then converted into the prefix when the segmentation efficiency is lower than the preset threshold. Such a method of converting a range into a prefix "if necessary" effectively avoids the rule expansion caused when all ranges are converted into prefixes. In addition, the rules that need to be replicated are extracted and put in another sub-rule set, that is, multiple decision trees are created, which therefore effectively reduces the rule replication.

Embodiment 5

Figure 14:
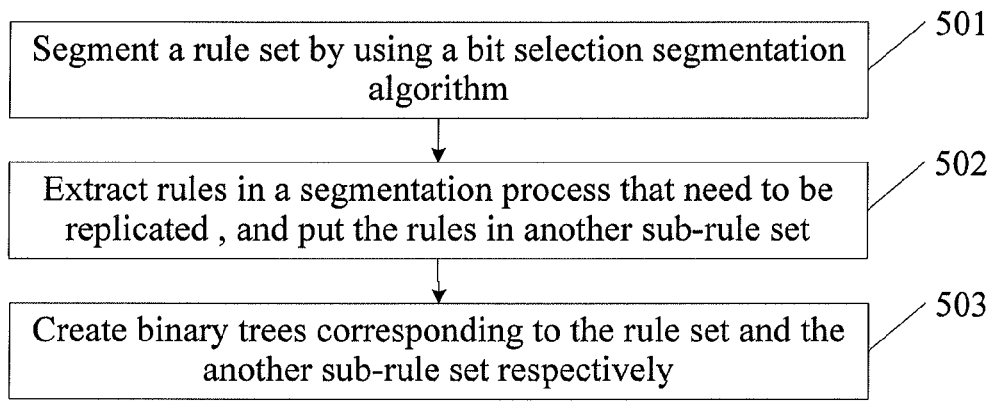
FIG. 14 is a flow chart of a method for creating a binary tree according to Embodiment 5 of the present disclosure.

Referring to FIG. 14, this embodiment provides a method for creating a binary tree by a processor. The method includes the following steps:

501: Segment a rule set by using a bit selection segmentation algorithm.

Details are the same as those of step 401, and are not described here again.

502: Extract rules in a segmentation process that need to be replicated and put the rules in another sub-rule set.

503: Create binary trees corresponding to the rule set and the another sub-rule set respectively.

Further, after the range is converted, the extended multiple rules share the same identifier with the original rules. Therefore, all rules with the same identifier that need to be replicated should be extracted and put in the another sub-rule set.

In the method according to this embodiment, the rules that need to be replicated are extracted and put in another sub-rule set, that is, multiple decision trees are created, which therefore effectively reduces the rule replication.

Embodiment 6

Figure 15:
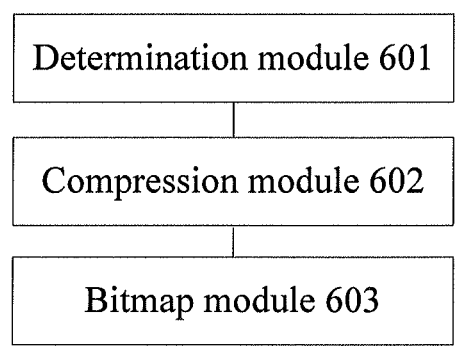
FIG. 15 is a schematic structural diagram of a device for compressing a binary tree according to Embodiment 6 of the present disclosure.

Referring to FIG. 15, this embodiment provides a device for compressing a binary tree, which includes a determination module 601, a compression module 602, and a bitmap module 603. The device has at least one processor configured to compress the binary tree.

The determination module 601 is configured to determine a compression parameter, in which the compression parameter is a number n of the compression layer or a number K of the intermediate node.

The compression module 602 is configured to compress a binary tree according to the compression parameter to form at least one compression node.

The bitmap module 603 is configured to create a bitmap of the compression node.

The determination module 601 is configured to determine the compression parameter according to a number of bits Nb of data read in one memory access, a number of bits Ni used by a bit index of each intermediate node, a number of bits Na used by a start address of a sub-node of a compression node, a number of bits Nt used by a compression node type, and a number of bits used by a bitmap.

The compression parameter is the number n of the compression layer.

The determination module 601 is configured to:
determine $$n \leq \mathrm{Log}_2\left(\frac{N_b - N_a - N_t}{N_i + 1} + 1\right)$$

according to $(2^n-1) \times N_i + (2^n-1) + N_a + N_t \leq N_b$, where Nb represents the number of bits of data read in one memory access, Ni represents the number of bits used by the bit index of each intermediate node, Na represents the number of bits used by the start address of the sub-node of the compression node, Nt represents the number of bits used by the compression node type, and $(2^n-1)$ represents the number of bits used by the bitmap.

The compression module 602 is configured to:
use, starting from a root node or leaf node of the binary tree, a node with the number of layers less than or equal to the number n of the compression layer as a compression node; and continue to compress the binary tree in the same way as compressing the compression node starting from a sub-node of the compression node until the binary tree is traversed.

The bitmap module 603 is configured to:
traverse the compression node in a breadth-first order, identify a type of each node in turn, and use an identification result as a shape bitmap of the compression node.

The compression parameter is the number K of the intermediate node.

The determination module 601 is configured to:
determine $$K \leq \frac{N_b - N_a - N_t + 1}{N_i + 3}$$

according to $K \times N_i + 2(K-1) + (K+1) + N_a + N_t \leq N_b$, where Nb represents the number of bits of data read in one memory access, Ni represents the number of bits used by the bit index of each intermediate node, Na represents the number of bits used by the start address of the sub-node of the compression node, Nt represents the number of bits used by the compression node type, 2(K−1) represents the number of bits used by a shape bitmap excluding the first node and the last two nodes, and (K+1) represents the number of bits used by an external bitmap.

The compression module 602 is configured to:
use, starting from a root node of the binary tree, a node with the number less than or equal to the number K of the intermediate node as a compression node; and continue to compress the binary tree in the same way as compressing the compression node starting from a sub-node of the compression node until the binary tree is traversed.

Further, after the binary tree is traversed, the compression node 602 is configured to:

count a number of all sub-intermediate nodes of each intermediate node including the intermediate node itself;

determine, starting from the root node of the binary tree, whether the number of all sub-intermediate nodes corresponding to the intermediate node including the intermediate node itself is less than or equal to the number K of the intermediate node;

keep the compression node unchanged when the number of all sub-intermediate nodes corresponding to each intermediate node in the compression node including the intermediate node itself is greater than the number K of the intermediate node; and use the intermediate node and all the sub-nodes of the intermediate node as a new compression node, and keep other nodes in the compression node than the intermediate node still in the compression node, when the number of all sub-intermediate nodes corresponding to the intermediate node in the compression node including the intermediate node itself is less than or equal to the number K of the intermediate node.

The bitmap module 603 is configured to:

traverse the compression node in a breadth-first order, identify the type of each node in turn, and use an identification result as a shape bitmap of the compression node; and traverse the compression node in the breadth-first order, identify the type of each sub-node in turn, and use an identification result as an external bitmap of the compression node.

The device further includes an incremental update module.

The incremental update module is configured to, when the type of a sub-node of the compression node changes after the bitmap of the compression node is created, adjust a bit in the external bitmap corresponding to the sub-node whose type changes, and keep the shape bitmap unchanged, so as to implement an incremental update.

In the device according to this embodiment, the number of the compression layer or the number of the intermediate node is determined, and multiple nodes are compressed into one node according to the number of the compression layer or the number of the intermediate node, and therefore the depth of the decision tree is greatly reduced and the search speed is improved.

Embodiment 7

Figure 16:
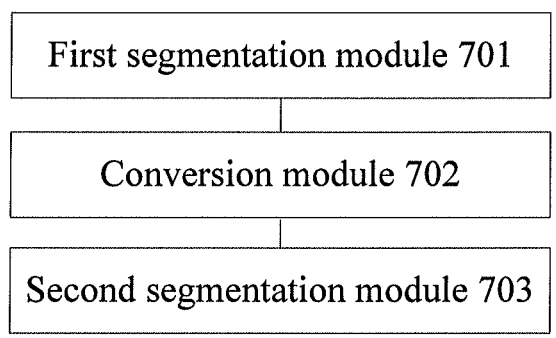
FIG. 16 is a schematic structural diagram of a device for creating a binary tree according to Embodiment 7 of the present disclosure.

Referring to FIG. 16, this embodiment provides a device having at least one processor for creating a binary tree, which includes a first segmentation module 701, a conversion module 702, a second segmentation module 703, and a creation module 704.

The first segmentation module 701 is configured to segment a non-range rule in a rule set by using a bit selection segmentation algorithm.

The conversion module 702 is configured to convert a range rule in the rule set into a prefix when segmentation efficiency is lower than a preset threshold, and keep an identifier of a rule corresponding to the prefix and an identifier corresponding to the range rule unchanged.

For example, when the segmentation efficiency is lower than the preset threshold, a range in the rule set are converted into a prefix, and keep an identifier of a rule corresponding to the prefix and an identifier of a rule corresponding to the range unchanged.

Further, after the range in the rule set is converted into the prefix, a rule that is covered and has a low priority is removed.

The second segmentation module 703 is configured to segment a converted rule set by using the bit selection segmentation algorithm.

The creation module 704 is configured to create a binary tree corresponding to the rule set according to all segmentation results.

The device further includes an extraction module.

The extraction module is configured to extract rules in a segmentation process that need to be replicated, and put the rules in another sub-rule set.

For example, all rules with the same identifier that need to be replicated are extracted and put in the another sub-rule set.

In the device according to this embodiment, the rule set is first segmented by using the bit selection segmentation algorithm, and the range in the rule set is then converted into the prefix when the segmentation efficiency is lower than the preset threshold. Such a method of converting a range into a prefix "if necessary" effectively avoids the rule expansion caused when all ranges are converted into prefixes. In addition, the rules that need to be replicated are extracted and put in another sub-rule set, that is, multiple decision trees are created, which therefore effectively reduces the rule replication.

Embodiment 8

Figure 17:
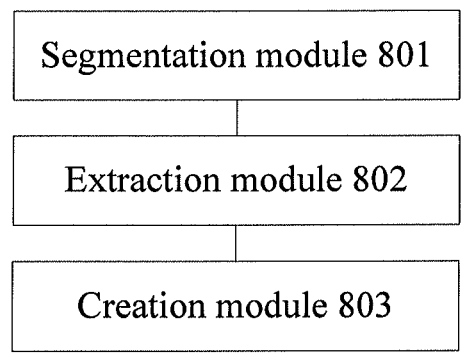
FIG. 17 is a schematic structural diagram of a device for creating a binary tree according to Embodiment 8 of the present disclosure.

Referring to FIG. 17, this embodiment provides a device having at least one processor for creating a binary tree, which includes a segmentation module 801, an extraction module 802, and a creation module 803.

The segmentation module 801 is configured to segment a rule set by using a bit selection segmentation algorithm.

The extraction module 802 is configured to extract rules in a segmentation process that need to be replicated, and put the rules in another sub-rule set.

The creation module 803 is configured to create binary trees corresponding to the rule set and the another sub-rule set respectively.

For example, all rules with the same identifier that need to be replicated are extracted and put in the another sub-rule set.

In the device according to this embodiment, the rules that need to be replicated are extracted and put in another sub-rule set, that is, multiple decision trees are created, which therefore effectively reduces the rule replication.

Embodiment 9

Figure 18:
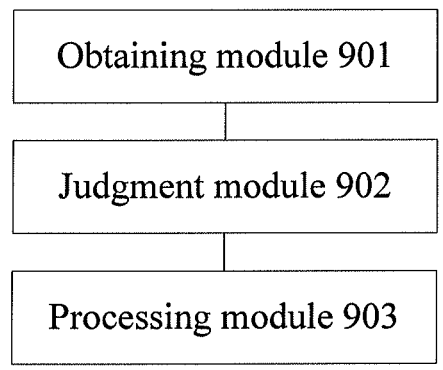
FIG. 18 is a schematic structural diagram of a device for searching a binary tree according to Embodiment 9 of the present disclosure.

Referring to FIG. 18, this embodiment provides a device having at least one processor for searching a binary tree, which includes an obtaining module 901, a determination module 902, and a processing module 903. The device may be a server that has at least one processor connected to storage medium accessible to the at least one processor.

The obtaining module 901 is configured to obtain a search keyword.

The determination module 902 is configured to determine whether each node of a binary tree is a leaf node or a compression node.

The processing module 903 is configured to, when a node is a compression node, parse the compression node; and when a node is a leaf node, traverse a linear table corresponding to the leaf node to search for a rule matching the keyword.

The processing module 903 includes a first parsing unit 903a configured to determine, according to a shape bitmap of the compression node, whether each node of the compression node is a leaf node. A detailed process is shown in FIG. 6, and is not described here again.

The processing module 903 includes a second parsing unit 903b configured to determine, according to the shape bitmap of the compression node, whether a node in the compression node is 0 in an external bitmap when the node is 0 in the shape bitmap, and determine, according to a determination result, whether a sub-node corresponding to the node in the compression node is a leaf node. A detailed process is shown in FIG. 11, and is not described here again.

In the device according to this embodiment, it is determined whether each node of the binary tree is a leaf node or a compression node, and when a node is a compression node, the compression node is parsed; when a node is a leaf node, the linear table corresponding to the leaf node is traversed to search for a rule matching the keyword, and therefore the search depth of the binary tree is reduced and the search speed is improved.

The embodiments of the present disclosure may be implemented by software, and corresponding software programs may be stored in readable storage medium, such as a hard disk, a buffer, or an optical disk of a computer that has at least a processor configured to implement the method stored in the storage medium.

The above descriptions are merely exemplary embodiments of the present disclosure, but not intended to limit the present disclosure. Any modification, equivalent replacement, and improvement made without departing from the spirit and principle of the present disclosure shall fall within the protection scope of the present disclosure.

What is claimed is:

1. A computer for compressing a binary tree, comprising: a memory; and a processor coupled with the memory, the processor is configured to perform operations comprising:

determining a compression parameter according to a number of bits $N_b$ of data read in one memory access, a number of bits $N_i$ used by a bit index of each intermediate node in intermediate nodes, a number of bits $N_a$ used by a start address of sub-nodes of a compression node, a number of bits $N_t$ used by a compression node type, and a number of bits used by a bitmap;

compressing the binary tree according to the compression parameter to form the compression node;

creating the bitmap of the compression node, wherein the compression parameter is a number n of compressed layers in one compression node, and is determined according to compressed layers in one compression node, and is determined according to $$n \le \mathrm{Log}_2\left(\frac{N_b - N_a - N_t}{N_i + 1} + 1\right);$$

applying the bitmap to the binary tree, wherein the binary tree represents a plurality of nodes including the intermediate nodes connected in a tree configuration, and said applying reduces the binary tree into a compressed binary tree with a reduced search depth; and applying the compressed binary tree to a packet classifier for performing routing decision for a packet at each of the plurality of nodes.

2. The computer according to claim 1, wherein the operations of compressing the binary tree according to the compression parameter to form at least one compression node comprises:

compressing, starting from a root node of the binary tree, m layers of nodes as a compression node, wherein m is less than or equal to the number n of the compressed layer in one compression node; and continuing to compress the binary tree in the same way as compressing the compression node starting from a sub-node of the compression node until the binary tree is traversed.

3. The computer according to claim 1, wherein the compression parameter is a number K of the intermediate nodes in one compression node, and K is determined according to $$K \le \frac{N_b - N_a - N_t + 1}{N_i + 3}.$$

4. The computer according to claim 3, wherein compressing the binary tree according to the compression parameter to form at least one compression node comprises: compressing, starting from a root node of the binary tree, nodes including a number T of intermediate nodes as a compression node, wherein the number T is less than or equal to the number K of the intermediate node in one compression node; and continuing to compress the binary tree in the same way as compressing the compression node starting from a sub-node of the compression node until the binary tree is traversed.

5. A non-transitory computer readable storage medium storing one or more programs, the one or more programs comprising instructions, which when executed by a computer, cause the computer to perform operations comprising:

determining a compression parameter according to a number of bits $N_b$ of data read in one memory access, a number of bits $N_i$ used by a bit index of a intermediate node, a number of bits $N_a$ used by a start address of sub-nodes of a compression node, a number of bits $N_t$ used by a compression node type, and a number of bits used by a bitmap;

compressing the binary tree according to the compression parameter to form at least one compression node;

creating the bitmap of the compression node, wherein the compression parameter is a number n of compressed layers in one compression node, and is determined according to $$n \le \mathrm{Log}_2\left(\frac{N_b - N_a - N_t}{N_i + 1} + 1\right);$$

applying the bitmap to the binary tree, wherein the binary tree represents a plurality of nodes including the intermediate nodes connected in a tree configuration, and said applying reduces the binary tree into a compressed binary tree with a reduced search depth; and applying the compressed binary tree to a packet classifier for performing routing decision for a packet at each of the plurality of nodes.

6. The computer readable storage medium according to claim 5, wherein the operations of compressing the binary tree according to the compression parameter to form at least one compression node comprises: compressing, starting from a root node of the binary tree, m layers of nodes as a compression node, wherein m is less than or equal to the number n of the compressed layer in one compression node; and continuing to compress the binary tree in the same way as compressing the compression node starting from a sub-node of the compression node until the binary tree is traversed.

7. The computer readable storage medium according to claim 5, wherein the compression parameter is a number K of the intermediate nodes in one compression node, and K is determined according to $$K \leq \frac{N_b - N_a - N_t + 1}{N_i + 3}.$$

8. The computer readable storage medium according to claim 7, wherein compressing the binary tree according to the compression parameter to form at least one compression node comprises:

compressing, starting from a root node of the binary tree, nodes including a number T of intermediate nodes as a compression node, wherein the number T is less than or equal to the number K of the intermediate node in one compression node; and continuing to compress the binary tree in the same way as compressing the compression node starting from a sub-node of the compression node until the binary tree is traversed.

* * * * *